US010833483B2

(12) United States Patent
Yuen

(10) Patent No.: US 10,833,483 B2
(45) Date of Patent: Nov. 10, 2020

(54) EMITTER ARRAY HAVING STRUCTURE FOR SUBMOUNT ATTACHMENT

(71) Applicant: Lumentum Operations LLC, Milpitas, CA (US)

(72) Inventor: Albert Yuen, Palo Alto, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/202,327

(22) Filed: Nov. 28, 2018

(65) Prior Publication Data

US 2019/0181619 A1   Jun. 13, 2019

Related U.S. Application Data

(60) Provisional application No. 62/595,934, filed on Dec. 7, 2017.

(51) Int. Cl.
| | |
|---|---|
| *H01S 5/183* | (2006.01) |
| *H01S 5/42* | (2006.01) |
| *H01S 5/022* | (2006.01) |
| *H01S 5/042* | (2006.01) |
| H01L 25/13 | (2006.01) |
| H01S 5/343 | (2006.01) |
| H01S 5/187 | (2006.01) |
| H01S 5/028 | (2006.01) |
| H01L 33/62 | (2010.01) |

(52) U.S. Cl.
CPC ............ *H01S 5/423* (2013.01); *H01S 5/0224* (2013.01); *H01S 5/04256* (2019.08); *H01S 5/18308* (2013.01); H01L 25/13 (2013.01); H01L 33/62 (2013.01); H01S 5/0282 (2013.01); *H01S 5/02272* (2013.01); *H01S 5/04254* (2019.08); *H01S 5/187* (2013.01); H01S 5/18305 (2013.01); H01S 5/18311 (2013.01); H01S 5/18313 (2013.01); H01S 5/18347 (2013.01); H01S 5/18394 (2013.01); H01S 5/343 (2013.01); H01S 2301/176 (2013.01)

(58) Field of Classification Search
CPC ............... H01S 5/0224; H01S 5/02244; H01S 5/18305; H01S 5/423
See application file for complete search history.

(56) References Cited

U.S. PATENT DOCUMENTS

| | | | | |
|---|---|---|---|---|
| 5,796,714 A | * | 8/1998 | Chino | ................. H01S 5/18305 257/84 |
| 2003/0006416 A1 | * | 1/2003 | Dudoff | ................. G02B 6/4204 257/79 |
| 2003/0234452 A1 | | 12/2003 | Tao et al. | |

(Continued)

*Primary Examiner* — Michael Carter
(74) *Attorney, Agent, or Firm* — Harrity & Harrity, LLP

(57) ABSTRACT

A vertical cavity surface emitting laser (VCSEL) array may comprise a plurality of VCSELs, a plurality of structures extending from a surface of the VCSEL array, and one or more metallization layers electrically connecting to one or more VCSELs of the plurality of VCSELs. The one or more metallization layers may include portions over the plurality of structures. The portions over the plurality of structures may extend to a height that is greater than other features on the surface of the VCSEL array. When the VCSEL array is on a submount, the plurality of structures may mechanically support the VCSEL array and to prevent the other features on the surface of the VCSEL array from contacting the submount.

21 Claims, 4 Drawing Sheets

(56) References Cited

U.S. PATENT DOCUMENTS

2004/0208416 A1   10/2004  Chakravorty et al.
2005/0169571 A1*  8/2005  Kaneko ................. B82Y 20/00
                                                  385/14
2009/0003401 A1*  1/2009  Sekiguchi ........... H01S 5/18305
                                                372/50.124

* cited by examiner

EMITTER ARRAY HAVING STRUCTURE FOR SUBMOUNT ATTACHMENT

RELATED APPLICATION

This application claims priority under 35 U.S.C. § 119 to U.S. Provisional Patent Application No. 62/595,934, filed on Dec. 7, 2017, the content of which is incorporated by reference herein in its entirety.

TECHNICAL FIELD

The present disclosure relates to an emitter array and, more particularly, to emitter array having structure for submount attachment.

BACKGROUND

A vertical emitter, such as a vertical cavity surface emitting laser (VCSEL), is a laser in which a beam is emitted in a direction perpendicular to a surface of a substrate (e.g., vertically from a surface of a semiconductor wafer). Multiple vertical emitters may be arranged in an array with a common substrate.

SUMMARY

According to some possible implementations, a vertical cavity surface emitting laser (VCSEL) array, comprising: a plurality of VCSELs; a plurality of structures extending from a surface of the VCSEL array; and one or more metallization layers electrically connecting to one or more VCSELs of the plurality of VCSELs, wherein the one or more metallization layers include portions over the plurality of structures, wherein the portions over the plurality of structures extend to a height that is greater than other features on the surface of the VCSEL array, and wherein, when the VCSEL array is on a submount, the plurality of structures is to mechanically support the VCSEL array and to prevent the other features on the surface of the VCSEL array from contacting the submount.

According to some possible implementations, an emitter array, comprising: a plurality of emitters; a plurality of structures extending from a surface of the emitter array; and one or more metallization layers over the plurality of structures and electrically connecting to one or more emitters of the plurality of emitters, wherein at least one respective portion of the one or more metallization layers, over the plurality of structures, extends to a height that is greater than other features on the surface of the emitter array, and wherein, when the emitter array is on the submount, the plurality of structures is to mechanically support the emitter array and to prevent the other features on the surface of the emitter array from contacting the submount.

According to some possible implementations, a laser array, comprising: a plurality of lasers; a plurality of structures extending from a surface of the laser array; and a first set of metallization layers covering the plurality of structures and electrically connecting one or more lasers of the plurality of lasers, wherein the plurality of structures causes at least one respective portion of the first set of metallization layers of the laser array to extend to a height that is greater than other features on the surface of the laser array, wherein the plurality of structures is to facilitate a connection between the first set of metallization layers of the laser array and a submount, and wherein, when the laser array is on the submount, the plurality of structures is to prevent the other features on the surface of the laser array from contacting the submount.

DETAILED DESCRIPTION

Figure 1:
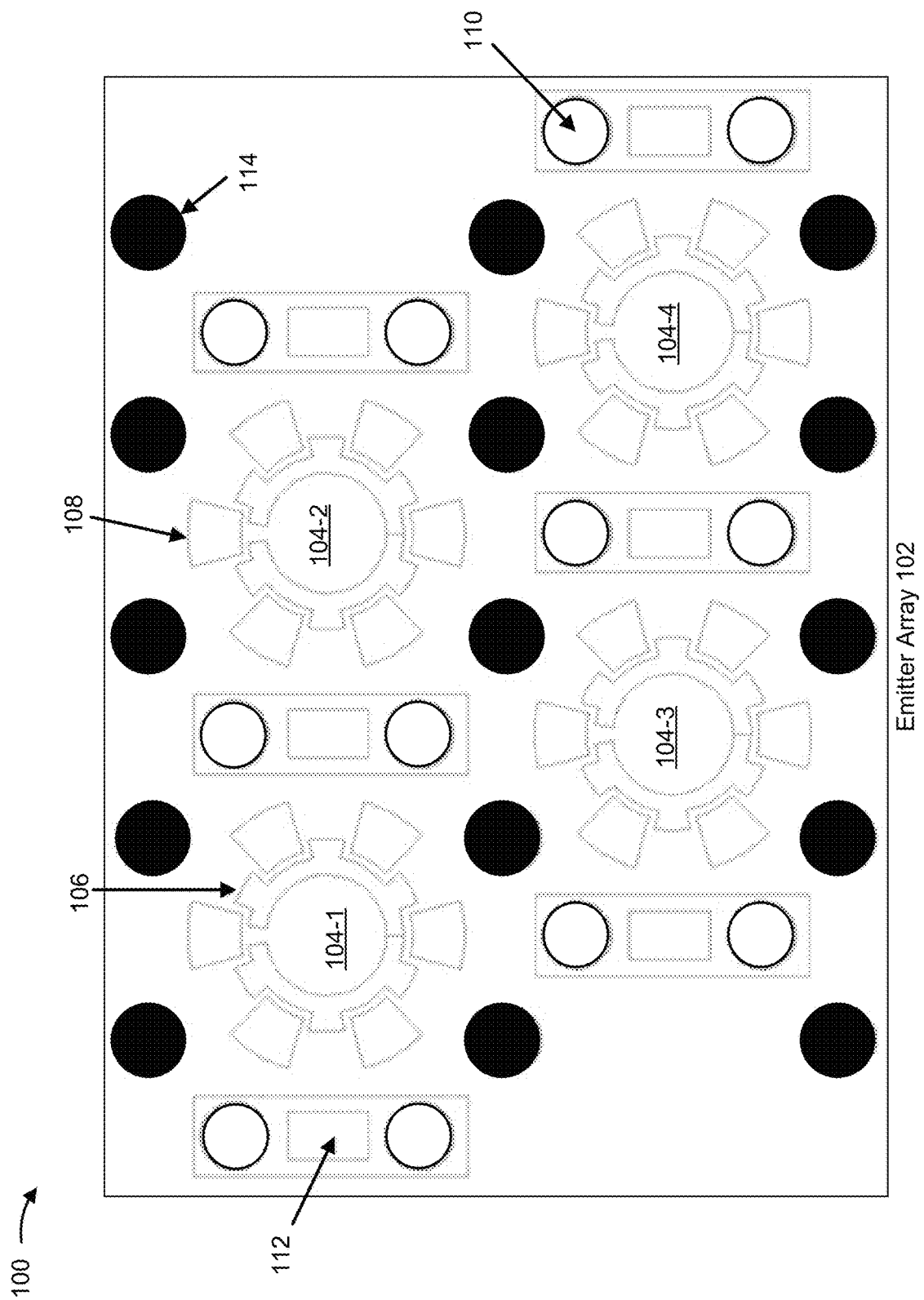
FIG. 1 is a diagram depicting a top-view of an example emitter array and associated connection structures for submount attachment.

The following detailed description of example implementations refers to the accompanying drawings. The same reference numbers in different drawings may identify the same or similar elements.

An emitter is typically attached to a submount using attachment material, such as conductive epoxy (e.g., silver epoxy) or a reflowable solder (e.g., gold-tin (AuSn) solder). This method works well for a top-emitting emitter as the p-n junction of the top-emitting emitter is close to the top (e.g., the emitting surface) of the top-emitting emitter and is at a low risk of being electrically shorted by the attachment material (e.g., due to the attachment material flowing up the sides of the emitter). Conversely, for a bottom-emitting emitter, the p-n junction is closer to the point of attachment of the bottom-emitting emitter to the submount due to the reversed orientation of the bottom-emitting emitter relative to a top-emitting emitter. In this case, when the bottom-emitting emitter is attached to a submount the attachment material may flow up the side of the bottom-emitting emitter far enough to electrically short the p-n junction of the bottom-emitting device. In addition, if an emitter array includes both p and n contacts on the same side of the emitter array, the attachment material may electrically short the contacts based on the attachment material flowing during the attachment process (e.g., the process of attaching an emitter array to a submount). In some cases, a top-emitting emitter can experience similar issues when the contacts for the top-emitting emitter are located on the same surface of the top-emitting emitter that is to be attached to a submount.

Some implementations described herein provide an emitter array that includes one or more connection structures between the emitter array and a metallization layer on a surface of the emitter array to be attached to a submount. Example connection structures include bumps, posts, pillars, extensions, spacers, supports, stacked layers, and/or the like. Example connection structures may have circular or other shapes. These structures, which may extend to a height that is greater than other features on the surface of the emitter array, provide a way to use the metallization layer to connect the emitter array to the submount. In this way, the p-n junctions of the emitter array are further from an attachment point between the emitter array and the submount. This reduces a likelihood that the p-n junctions will be electrically shorted when the emitter array is attached to the submount, thereby improving manufacturing of the emitter array and/or conserving costs that would be consumed re-manufacturing an electrically shorted emitter array. In addition, this reduces a quantity of emitters of an emitter array that may be shorted during manufacturing, thereby improving a quality of a resulting device that uses the emitter array. Further, this reduces or eliminates a need to use a reflowable attachment material, thereby reducing a likelihood that one or more emitters of an emitter array will be electrically shorted during manufacturing of the emitter array. Further, this reduces or eliminates a need to use heat during the attachment process (e.g., heat that would be used to reflow solder and/or conductive epoxy), thereby reducing or eliminating damage that could occur to the emitter array from use of the heat.

FIG. 1 is a diagram of an example implementation 100 depicting a top-view of an example emitter array and associated connection structures for submount attachment. As shown in FIG. 1, implementation 100 includes an emitter array 102. For example, assume that emitter array is a bottom-emitting emitter array and the surface shown in FIG. 1 is the attachment surface for emitter array 102 (e.g., the surface to be attached to a submount). As further shown in FIG. 1, emitter array 102 may include a set of emitters 104 (e.g., shown as emitters 104-1 through 104-4). For example, emitter 104 may include a light-emitting diode (LED), a VCSEL, a vertical external cavity surface emitting laser (VECSEL), a laser, a light-emitting device, and/or the like. In some implementations, emitters 104 may be arranged in a regular two-dimensional pattern, as shown in FIG. 1. Conversely, in some implementations, emitters 104 may be arranged in a random pattern, a semi-random pattern (e.g., where some of emitters 104 are arranged in a regular two-dimensional pattern and others are arranged in a random two-dimensional pattern), and/or the like.

As shown by reference number 106, emitter 104 may be associated with a p-contact metallization (e.g., a P-Ohmic metal layer). For example, the p-contact metallization may facilitate flow of electric current to and/or from emitter 104. In addition, and as shown by reference number 108, emitter 104 may be associated with a set of oxidation trenches. For example, the set of oxidation trenches may confine electric current, may electrically isolate emitter 104 from other emitters 104 of emitter array 102, and/or the like.

Reference number 110 shows an n-contact connection structure. For example, the n-contact connection structure may be associated with and/or form an n-contact that is to be attached to a submount (e.g., a carrier, a printed circuit board (PCB), and/or the like). As further shown in FIG. 1, emitter 104 may be associated with one or more sets of n-contact connection structures. For example, a row of emitters 104 may be associated with a set of n-contact connection structures at the ends of the row. Additionally, or alternatively, and as another example, there may be a set of n-contact connection structures between adjacent emitters 104 in the row of emitters 104. Similar configurations of n-contact connection structures may apply to columns of emitters 104, in some implementations. As shown by reference number 112, a set of n-contact connection structures may be associated with a via opening. For example, a via opening may extend to an n-substrate of emitter array 102. In some implementations, a connection structure described herein may have a rectangular shape, a square shape, a circular shape, a ring shape, and/or the like that extends from a surface of a VCSEL array.

Reference number 114 shows a p-contact connection structure. For example, the p-contact connection structure may be associated with and/or form a p-contact that is to be attached to a submount. As further shown in FIG. 1, emitter 104 may be associated with one or more sets of p-contact connection structures. For example, a row of emitters 104 may be associated with a set of p-contact connection structures at the ends of the row. Additionally, or alternatively, and as another example, there may be a set of p-contact connection structures between adjacent emitters 104 of the row of emitters 104. Similar configurations of p-contact connection structures may apply to columns of emitters 104, in some implementations.

In some implementations, and as described elsewhere herein, the p-contact connection structures and/or the n-contact connection structures may extend to a height that is greater than other features on a surface of emitter array 102. For example, the p-contact connection structures and/or the n-contact connection structures may extend to a height that is greater than an optical aperture of emitter 104, a mesa structure of emitter 104, an emission area of emitter 104, and/or the like. Although the p-contact connection structures and the n-contact connection structures are shown in FIG. 1 (e.g., as black and white circles, respectively), a metallization layer may be formed on the p-contact connection structures and the n-contact connection structures (e.g., may cover the p-contact connection structures and the n-contact connection structures, may interconnect some or all of the p-contact connection structures, may interconnect some or all of the n-contact connection structures, and/or the like). In some implementations, the height of a portion of the metallization layer on a connection surface of a p-contact connection structure and/or an n-contact connection structure (e.g., a surface to be connected to a submount) may be greater than the other features on a surface of emitter array 102 (e.g., the metallization layer may be formed on connection structures that extend to height that is greater than the other features, may be formed on connection structures that do not extend to a height that is greater than the other features but the thickness of the metallization layer causes a surface of portions of the metallization layer to be at a height that is greater than the other features, and/or the like). In some implementations, the portions of the metallization layer that cover the connection surface of the p-contact connection structures and/or the n-contact connection structures may be compressed when emitter array 102 is attached (e.g., contacted) to a submount. As such, the thickness of the portions of the metallization layer may be configured to account for this compression, while additionally being configured such that compressed material does not electrically short emitter array 102.

In some implementations, emitter array 102 may include either p-contact connection structures or n-contact connection structures, depending on a configuration of emitter array 102. For example, some configurations of emitter array 102 may not need electrical connectivity of both p-contacts and n-contacts to a submount. In these cases, emitter array 102 may include connection structures for the p-contacts and/or the n-contacts that are to be electrically connected to the submount. In some implementations, a connection structure may not be associated with a p-contact or an n-contact. In this case, a connection structure may be used to attach emitter array 102 to a submount rather than to both attach emitter array 102 to the submount and provide electrical connectivity to the submount. In this way, a connection structure may facilitate a connection (e.g., a mechanical and/or an electrical connection) to a submount.

In this way, when emitter array 102 is attached to a submount (e.g., when the metallization layer of emitter array 102 is attached to a metallization layer of the submount), only the portions of the metallization layer of emitter array 102 that are formed on the connection surface of the connection structures may contact the metallization layer of the submount (e.g., when emitter array 102 is on the submount, the connection structures may mechanically support emitter array 102 and may prevent other features on the surface of emitter array 102 from contacting the submount). In some cases, this attachment may occur via ultrasonic welding or another process that does not use an attachment material, such as conducting epoxy or reflowable solder. This reduces or eliminates electrical shorts of emitters 104 of emitter array 102, thereby improving a quality of emitter array 102. In addition, this reduces or eliminates damage that could occur to other features on a surface of emitter array 102 and/or emitter 104 from use of an attachment material. Further, this reduces or eliminates a need to re-manufacture emitter array 102 due to electrically shorted emitters 104, thereby conserving resources associated with re-manufacturing emitter array 102, costs associated with re-manufacturing emitter array 102, and/or the like.

As indicated above, FIG. 1 is provided merely as an example. Other examples are possible and may differ from what was described with regard to FIG. 1. For example, emitter array 102 and/or emitter 104 may include additional elements, fewer elements, different elements, and/or differently arranged elements that what is shown in FIG. 1.

In some implementations, a connection structure described herein may facilitate a mechanical connection alone (e.g., based on a metallization layer on the connection structure not being connected to a metallization layer of a submount), or an electrical connection alone (e.g., based on a metallization layer on the connection structure being connected to the metallization layer of the submount). In other words, emitter array 102 may include some connection structures that facilitate mechanical connections only (despite being covered by a metallization layer), some connection structures that facilitate electrical connections only, and some connection structures that facilitate both mechanical connections (e.g., for mechanical support) and electrical connections (e.g., for power). In some implementations, a connection structure described herein may be associated with a single emitter 104, or may be shared by adjacent emitters 104. In some implementations, emitter array 102 may include multiple metallization layers with different sets of connection structures. For example, emitter array 102 may include different metallization layers for different subsets of emitters 104, and the different metallization layers may include different sets of connection structures for the different subsets of emitters 104. Additionally, or alternatively, although described with regard to a bottom-emitting emitter, the implementations described with regard to FIG. 1 may apply to a top-emitting emitter.

Figure 2A:
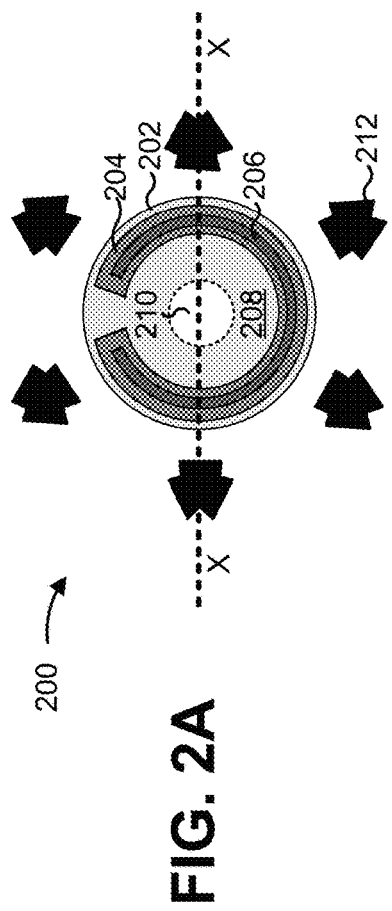
FIGS. 2A and 2B are diagrams depicting a top-view of an example vertical-emitting device and a cross-sectional view of the example vertical-emitting device, respectively.
Figure 2B:
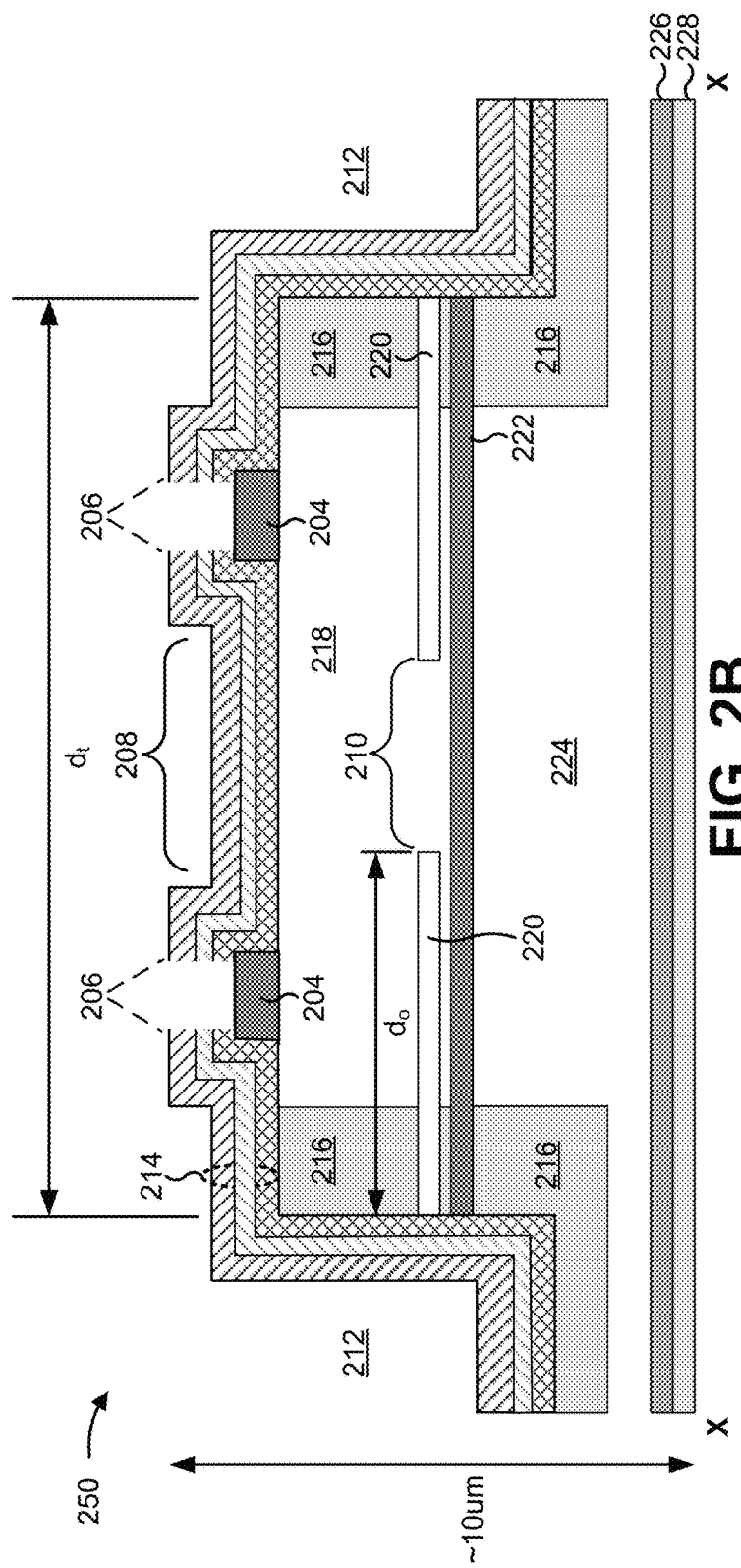

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an Al¬2O3 layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as do in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a SiO2 layer, a Si3N4 layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/ mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bond pad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
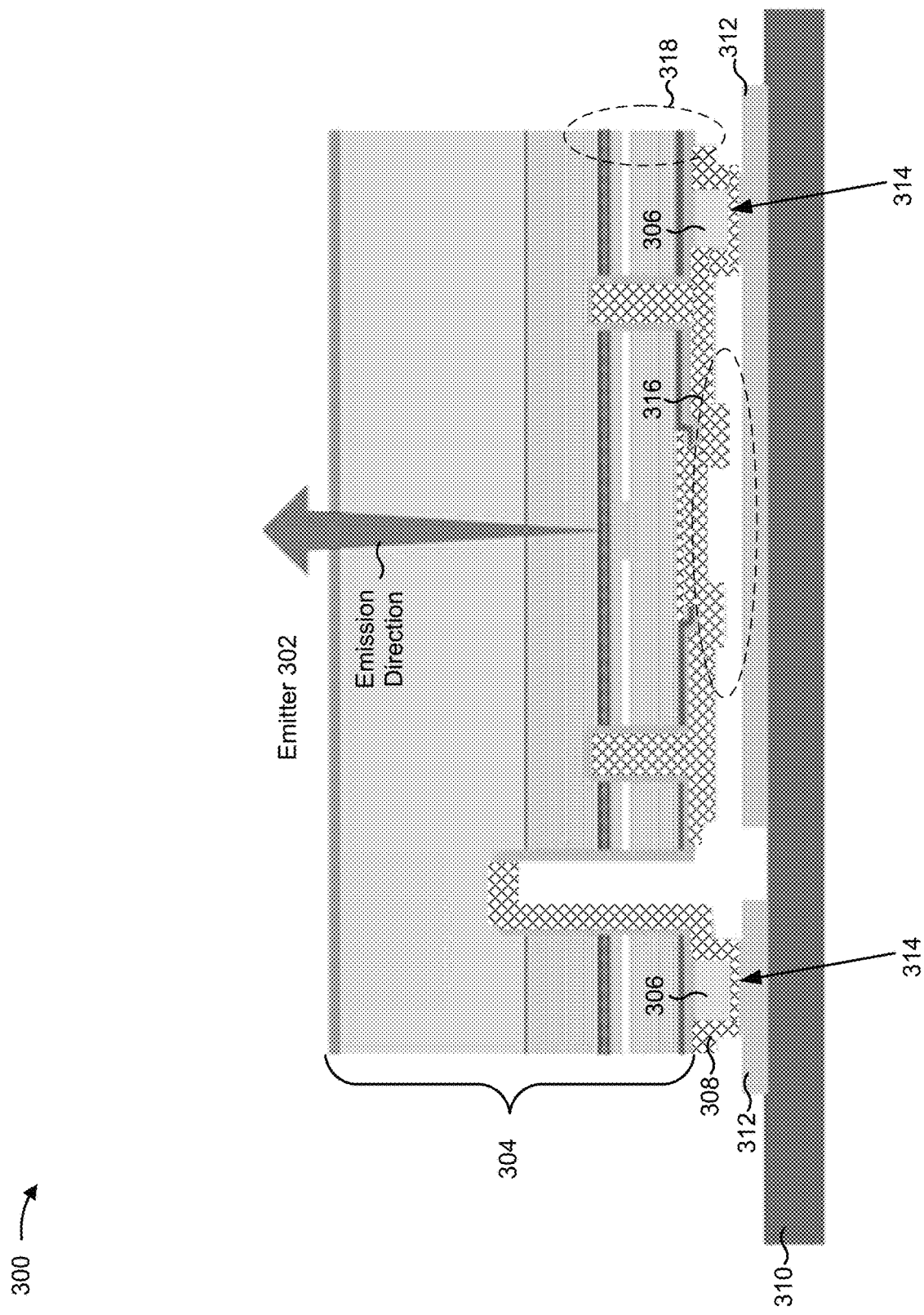
FIG. 3 is a diagram depicting a cross-sectional view of an example emitter of an emitter array and associated connection structures for submount attachment.

FIG. 3 is a diagram of an example implementation 300 depicting a cross-sectional view of an example emitter of an emitter array and associated connection structures for submount attachment. As shown in FIG. 3, implementation 300 includes emitter 302. For example, emitter 302 may be included in an emitter array. FIG. 3 may show a portion and/or simplified version of an emitter array for explanatory purposes and/or illustrative purposes. For example, the emitter array may include additional emitters 302 and/or features, fewer emitters 302 and/or features, different emitters 302 and/or features, and/or differently arranged emitters 302 and/or features than those shown in FIG. 3. In some implementations, emitter 302 may include one or more layers 304, one or more connection structures 306, and/or a metallization layer 308.

As further shown in FIG. 3, emitter 302 may include various layers 304. For example, layers 304 may include a substrate layer, one or more epitaxial layers, and/or the like. In some implementations, and as shown in FIG. 3, emitter 302 may include a set of connection structures 306 formed on layers 304. For example, emitter 302 may include a connection structure 306 at a location associated with a p-contact of emitter 302 and/or another connection structure 306 at another location associated with an n-contact of emitter 302. In some implementations, connection structure 306 may be comprised of a material that is rigid or semi-rigid, such that connection structure 306 is resistive to compression when an emitter array with which emitter 302 is associated is attached to a submount (e.g., submount 310). For example, connection structure 306 may comprise a polyimide material, a benzocyclobutene (BCB) material, and/or the like. Additionally, or alternatively, and as another example, connection structure 306 may comprise an electrically conductive material, such as a metal (e.g., the same metal as metallization layer 308).

In some implementations, connection structure 306 may extend to a height that greater than other features on a surface of emitter 302. For example, connection structure 306 may extend to a height that is greater than an optical aperture of emitter 302, a mesa structure of emitter 302, and/or the like. Conversely, connection structure 306 may not extend to a height that is greater than other features on a surface of emitter 302, but rather may extend to a height that, in combination with a thickness of a portion of a metallization layer on, over or covering connection structure 306, causes a surface of the portion of the metallization to be at a height that is greater than other features on a surface of emitter 302 and/or prevents other features on a surface of emitter 302 from contacting submount 310 when the emitter array with which emitter 302 is associated is attached to submount 310.

As further shown in FIG. 3, emitter 302 may include metallization layer 308 formed on emitter 302, including the set of connection structures 306. In some implementations, metallization layer 308 may comprise an electrically conductive material, such as a metal (e.g., a malleable low oxidation metal, such as gold, aluminum, copper, and/or the like). In some implementations, and as shown in FIG. 3, a surface of a portion of metallization layer 308 (e.g., the surface contacting submount metallization layer 312 and the portion that is on a connection surface of connection structure 306, as described below) may be at a height that is greater than other features on a surface of emitter 302 when connected to submount metallization layer 312.

As further shown in FIG. 3, implementation 300 includes submount 310. For example, submount 310 may include a carrier, a PCB, and/or the like. In some implementations, submount 310 may include submount metallization layer 312. In some implementations, submount metallization layer 312, may include various electrically isolated portions that correspond to p-contacts and/or n-contacts of emitter 302. In some implementations, submount metallization layer 312 may be the same as or similar to metallization layer 308 (e.g., may be the same metal).

As shown by reference numbers 314, when emitter 302 is connected to submount 310, portions of metallization layer 308 (e.g., portions on a connection surface of connection structure 306 that is perpendicular to the emission direction of emitter 302) may be connected to corresponding portions of submount metallization layer 312. In some implementations, emitter 302 may be connected to submount 310 via ultrasonic welding between the portions of metallization layer 308 on connection structures 306 (shown by reference numbers 314) and the corresponding portions of submount metallization layer 312. As such, the portions of metallization layer 308 may be compressed due to pressure and/or vibrations applied to emitter 302 and/or submount 310 during the attachment process.

As a result, during manufacturing of emitter 302, the thickness of the portions of metallization layer 308 may need to be configured such that the thickness allows for some compression without allowing other features on a surface of emitter 302 to contact submount metallization layer 312 and/or without allowing metallization layer 308 to be pushed up a side wall of emitter 302 to electrically short a p-n junction of emitter 302. For example, and as shown by reference number 316, when emitter 302 is connected to submount 310, an optical aperture of emitter 302 (or a portion of metallization layer 308 associated with the optical aperture) may not contact submount metallization layer 312 (or a portion thereof) despite compression of portions of metallization layer 308 (e.g., portions corresponding to reference numbers 314) during the attachment process. In some implementations, portions of emitter 302 may contact submount 310 (e.g., may electrically contact submount 310, may thermally contact submount 310, and/or the like).

Additionally, or alternatively, and as another example shown by reference number 318, despite compression of portions of metallization layer 308 (e.g., portions corresponding to reference numbers 314), the p-n junction of emitter 302 is not electrically shorted (e.g., by material flowing, or being pushed, up a side wall of emitter 302, as could occur with use of reflowable solder or conductive epoxy). In this way, use of connection structures 306 and metallization layer 308 to connect emitter 302 to submount 310 may reduce or eliminate electrical shorting of emitter 302. This improves manufacturing of emitter 302 relative to use of reflowable solder, conductive epoxy, and/or the like as an attachment material.

As indicated above, FIG. 3 is provided merely as an example. Other examples are possible and may differ from what was described with regard to FIG. 3. The number, arrangement, thicknesses, order, symmetry, or the like, of layers shown in FIG. 3 is provided as an example. In practice, emitter 302 may include additional layers, fewer layers, different layers, differently constructed layers, or differently arranged layers than those shown in FIG. 3. Additionally, or alternatively, a set layers (e.g., one or more layers) of emitter 302 may perform one or more functions described as being performed by another set of layers of emitter 302.

Figure 4:
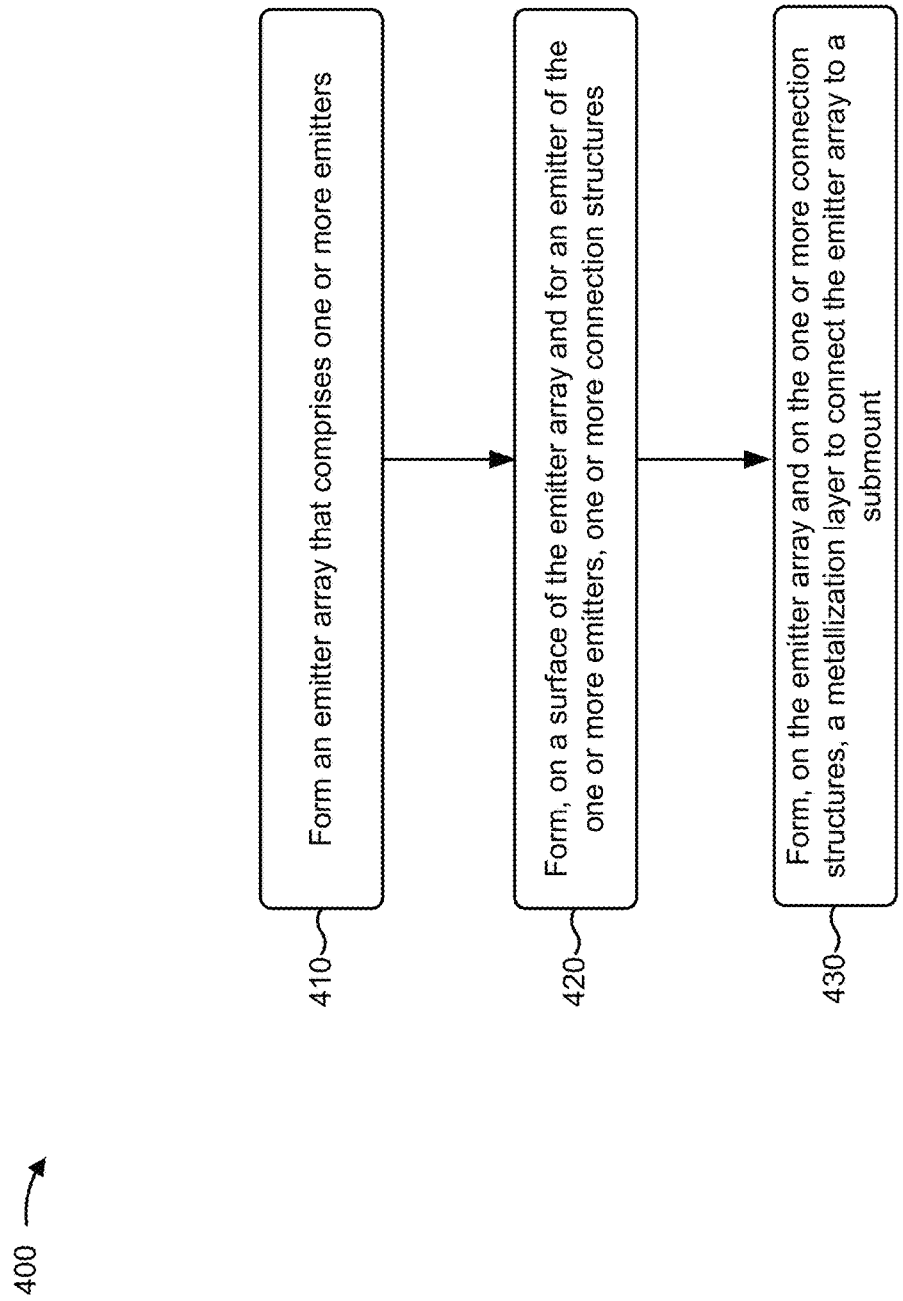
FIG. 4 is a flow chart of an example process for an emitter array that includes one or more connection structures for submount attachment.

FIG. 4 is a flow chart of an example process 400 for manufacturing an emitter array capable of emitter submount attachment using a connection structure. For example, FIG. 4 shows an example process for manufacturing an emitter array capable of emitter submount attachment using a connection structure.

As shown in FIG. 4, process 400 may include forming an emitter array that comprises one or more emitters (block 410). For example, process 400 may include forming an emitter array that comprises one or more emitters 302.

In some implementations, to form emitter 302, various epitaxial layers 304 may be formed on a substrate layer. For example, the substrate layer may include a gallium arsenide (GaAs) substrate. In some implementations, trenches may be etched into layers of emitter 302 (e.g., using a wet etching technique or a dry etching technique). In some implementations, emitters 302 may be formed in a pattern. For example, emitters 302 may be formed in a uniform pattern, such as a matrix pattern, a lattice pattern, and/or the like. In some implementations, and as another example, emitters 302 may be formed in a non-uniform pattern, such as a random pattern, a non-repeating pattern, and/or the like. In some implementations, and as yet another example, some emitters 302 may be formed in a uniform pattern and some emitters 302 may be formed in a non-uniform pattern.

In this way, process 400 may include forming an emitter array that comprises one or more emitters 302.

As further shown in FIG. 4, process 400 may include forming, on a surface of the emitter array and for an emitter of the one or more emitters, one or more connection structures (block 420). For example, process 400 may include forming, on a surface of the emitter array and for emitter 302 of the one or more emitters 302, one or more connection structures 306.

In some implementations, connection structure 306 may be formed on layers 304, such that connection structure 306 extends from a surface of emitter 302. In some implementations, connection structure 306 may be formed at a location associated with a p-contact of emitter 302. Additionally, or alternatively, connection structure 306 may be formed at a location associated with an n-contact of emitter 302. In some implementations, connection structure 306 may be formed to a particular height. For example, connection structure 306 may be formed such that connection structure 306 extends to a height that is greater than other features on a surface of emitter 302. Continuing with the previous example, connection structure 306 may extend to a height that is between approximately five microns and 10 microns higher than the other features on a surface of emitter 302. Additionally, or alternatively, and as another example, connection structure 306 may be formed such that a height of connection structure 306, plus a thickness of a compressed portion of metallization layer 308 on connection structure 306, prevents other features on a surface of emitter 302 from contacting submount metallization layer 312 and/or prevents electrical shorting of emitter 302. Continuing with the previous example, a thickness of metallization layer 308 may be between approximately five microns and 10 microns before being compressed and less than approximately one micron after being compressed.

In this way, process 400 may include forming, on a surface of the emitter array and for emitter 302 of the one or more emitters 302, one or more connection structures 306.

As further shown in FIG. 4, process 400 may include forming, on the emitter array and on the one or more connection structures, a metallization layer to connect the emitter array to a submount (block 430). For example, process 400 may include forming, on the emitter array and on the one or more connection structures 306, metallization layer 308 to connect the emitter array to submount 310.

In some implementations, metallization layer 308 may be formed on a surface of layers 304 of emitter 302. Additionally, or alternatively, metallization layer 308 may be formed on connection structure 306. In some implementations, a portion of metallization layer 308 (e.g., to be connected to submount 310) may extend to a height that is higher than other features on a surface of emitter 302 based on a height of connection structure 306, a thickness of metallization layer 308, and/or the like. In some implementations, metallization layer 308 may be formed such that a thickness of a portion of metallization layer 308 to be connected to submount 310 can be compressed during attachment to submount 310 without allowing other features on a surface of emitter 302 to contact submount metallization layer 312 of submount 310 and/or without electrically shorting emitter 302.

In this way, process 400 may include forming, on the emitter array and on the one or more connection structures 306, metallization layer 308 to connect the emitter array to submount 310.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, connection structure 306, formed on emitter 302, may provide a way for metallization layer 308 to be connected to submount metallization layer 312 without using an attachment material such as conductive epoxy, reflowable solder, and/or the like. This reduces or eliminates electrical shorts of emitter 302, thereby improving a quality of emitter 302. In addition, this reduces or eliminates a need to re-manufacture emitter 302 due to an electrical short of emitter 302, thereby conserving resources and/or costs associated with re-manufacturing emitter 302. Further, this provides a more structurally secure connection between emitter 302 and submount 310 via use of ultrasonic welding relative to a connection formed using conductive epoxy, reflowable solder, and/or the like, thereby improving emitter 302.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A bottom-emitting vertical cavity surface emitting laser (VCSEL) array, comprising:
   a plurality of bottom-emitting VCSELs;
   a plurality of structures extending from a surface of the bottom-emitting VCSEL array; and
   one or more metallization layers electrically connecting to one or more bottom-emitting VCSELs of the plurality of bottom-emitting VCSELs,
      wherein the one or more metallization layers include portions over the plurality of structures,
      wherein the portions over the plurality of structures extend to a height that is greater than other features on the surface of the bottom-emitting VCSEL array,
         wherein the other features include a portion of the one or more metallization layers associated with an optical aperture,
      wherein, when the bottom-emitting VCSEL array is on a submount, the plurality of structures is to mechanically support the bottom-emitting VCSEL array and to prevent the other features on the surface of the bottom-emitting VCSEL array from contacting the submount, and
      wherein the plurality of bottom-emitting VCSELs are configured to emit light in a direction away from the submount.

2. The bottom-emitting VCSEL array of claim 1, wherein the plurality of structures comprises:
   a polyimide material,
   a benzocyclobutene (BCB) material, or
   a metal, wherein the metal is a same metal as the one or more metallization layers.

3. The bottom-emitting VCSEL array of claim 1, wherein the portions over the plurality of structures are associated with a p-contact of the bottom-emitting VCSEL array.

4. The bottom-emitting VCSEL array of claim 1, wherein the portions over the plurality of structures are associated with an n-contact of the bottom-emitting VCSEL array.

5. The bottom-emitting VCSEL array of claim 1, wherein the portions over the plurality of structures are compressed without shorting the plurality of bottom-emitting VCSELs when in contact with the submount.

6. The bottom-emitting VCSEL array of claim 1, wherein the height to which the portions over the plurality of structures extend is between approximately five microns and 10 microns higher than the other features on the surface of the bottom-emitting VCSEL array.

7. The bottom-emitting VCSEL array of claim 1, wherein the one or more metallization layers directly contact a metallization layer of the submount.

8. A bottom-emitting emitter array, comprising:
a plurality of bottom-emitting emitters;
a plurality of structures extending from a surface of the bottom-emitting emitter array; and
one or more metallization layers over the plurality of structures and electrically connecting to one or more emitters of the plurality of bottom-emitting emitters,
wherein at least one respective portion of the one or more metallization layers, over the plurality of structures, extends to a height that is greater than other features on the surface of the bottom-emitting emitter array,
wherein the other features include a portion of the one or more metallization layers associated with an optical aperture,
wherein, when the bottom-emitting emitter array is on a submount, the plurality of structures is to mechanically support the bottom-emitting emitter array and to prevent the other features on the surface of the bottom-emitting emitter array from contacting the submount, and
wherein the plurality of bottom-emitting emitters are configured to emit light in a direction away from the submount.

9. The bottom-emitting emitter array of claim 8, wherein the at least one respective portion of the one or more metallization layers is associated with one or more p-contacts of the bottom-emitting emitter array,
wherein the one or more p-contacts are shared by the plurality of bottom-emitting emitters.

10. The bottom-emitting emitter array of claim 8, wherein the at least one respective portion of the one or more metallization layers is associated with one or more n-contacts of the bottom-emitting emitter array,
wherein the one or more n-contacts are shared by the plurality of bottom-emitting emitters.

11. The bottom-emitting emitter array of claim 8, wherein the plurality of bottom-emitting emitters is associated with a respective p-contact,
wherein the respective p-contact is associated with a respective portion of the at least one respective portion of the one or more metallization layers.

12. The bottom-emitting emitter array of claim 8, wherein the plurality of bottom-emitting emitters is associated with a respective n-contact,
wherein the respective n-contact is associated with a respective portion of the at least one respective portion of the one or more metallization layers.

13. The bottom-emitting emitter array of claim 8, wherein the height of the at least one respective portion of the one or more metallization layers permits compression of the at least one respective portion of the one or more metallization layers without shorting the bottom-emitting emitter array.

14. The bottom-emitting emitter array of claim 8, wherein the other features on the surface of the bottom-emitting emitter array include respective portions of the one or more metallization layers associated with respective emission areas of the plurality of bottom-emitting emitters.

15. A bottom-emitting laser array, comprising:
a plurality of bottom-emitting lasers;
a plurality of structures extending from a surface of the bottom-emitting laser array; and
a first set of metallization layers covering the plurality of structures and electrically connecting one or more bottom-emitting lasers of the plurality of bottom-emitting lasers,
wherein the plurality of structures causes at least one respective portion of the first set of metallization layers of the bottom-emitting laser array to extend to a height that is greater than other features on the surface of the bottom-emitting laser array,
wherein the other features include a portion of the one or more metallization layers associated with an optical aperture,
wherein the plurality of structures is to facilitate a connection between the first set of metallization layers of the bottom-emitting laser array and a submount,
wherein, when the bottom-emitting laser array is on the submount, the plurality of structures is to prevent the other features on the surface of the bottom-emitting laser array from contacting the submount, and
wherein the plurality of bottom-emitting lasers are configured to emit light in a direction away from the submount.

16. The bottom-emitting laser array of claim 15, wherein a thickness of the at least one respective portion of the first set of metallization layers is based on the height of the plurality of structures.

17. The bottom-emitting laser array of claim 15, further comprising:
at least one contact associated with the bottom-emitting laser array,
wherein the at least one contact includes at least one p-contact or at least one n-contact.

18. The bottom-emitting laser array of claim 15, wherein the first set of metallization layers and a second metallization layer both comprise a same type of metal material.

19. The bottom-emitting laser array of claim 15, wherein a thickness of the at least one respective portion of the first set of metallization layers facilitates compression of the at least one respective portion of the first set of metallization layers when the at least one respective portion of the first set of metallization layers is contacted to a second metallization layer while preventing the other features on the surface of the bottom-emitting laser array from contacting the second metallization layer.

20. The bottom-emitting laser array of claim 15, wherein the first set of metallization layers comprises a malleable low oxidation metal.

21. The bottom-emitting laser array of claim 15, wherein the connection is an electrical connection or a mechanical connection.

\* \* \* \* \*